United States Patent [19]

Shank et al.

[11] Patent Number: 4,647,915

[45] Date of Patent: Mar. 3, 1987

[54] METHOD AND APPARATUS FOR ADJUSTING DISPLAYED OSCILLOSCOPE PARAMETERS

[75] Inventors: Gordon W. Shank, Portland; Lloyd R. Bristol, Tigard, both of Oreg.

[73] Assignee: Tektronix, Inc., Beaverton, Oreg.

[21] Appl. No.: 665,691

[22] Filed: Oct. 29, 1984

[51] Int. Cl.4 .......................................... G01R 13/22
[52] U.S. Cl. .................................... 340/709; 340/722; 324/77 R; 324/121 R; 377/110
[58] Field of Search ............ 340/706, 709, 736, 740, 340/753; 324/77 C, 77 CS, 88, 121 R, 121 E; 377/51, 55, 110; 368/51, 74

[56] References Cited

U.S. PATENT DOCUMENTS

| | | | |
|---|---|---|---|
| 4,072,851 | 2/1978 | Rose | 324/121 R |
| 4,185,281 | 1/1980 | Silverstone | 340/709 |
| 4,504,716 | 3/1985 | Sakamoto | 368/74 |
| 4,544,885 | 10/1985 | Takahashi | 324/121 R |
| 4,578,640 | 3/1986 | Crooke et al. | 340/722 |

Primary Examiner—Gerald L. Brigance
Attorney, Agent, or Firm—John Smith-Hill; John P. Dellett

[57] ABSTRACT

A delayed sweep oscilloscope having a word recognizer displays multi-digit parameters representing an event count necessary to initiate a delayed sweep, and a word to be recognized on oscilloscope data input lines. The numbers are modified digit-by-digit by rotating a first control knob to move a cursor on the screen to select a digit to be altered and then by rotating a second control knob to alter the selected digit. The control knobs are mounted on the oscilloscope front panel and when not used to modify these parameters, the control knobs may be used to control other oscilloscope functions.

13 Claims, 10 Drawing Figures

DLY/EVTS        LOGIC-TRIGGER              A  DBE  76543210
57⏜                                                      ⌐55

FIG. 4A                                    FIG. 4C

SWP<A   B>      START<A   WR>        DLY BY<B   WR>
57⏜ 55⏜                  ⌐55                     55⏜

FIG. 4B

SWP:TRG<A:A×B       A:A+B       A:WR     B:WR>
                                           ⌐55

FIG. 4D

RADIX<BIN   OCT   HEX>      CLOCK<R   F   X>
57⏜    ⌐55                               55⏜

METHOD AND APPARATUS FOR ADJUSTING DISPLAYED OSCILLOSCOPE PARAMETERS

BACKGROUND OF THE INVENTION

The present invention relates to oscilloscopes of the type providing a digital display of adjustable parameters relating to oscilloscope operation and particularly to a method and apparatus for adjusting the parameters.

A major feature of delayed sweep oscilloscopes is the ability to initiate a second (B) sweep at a selectable point along a first (A) sweep to view an event of interest with closer scrutiny and to provide greater precision in making timing measurements. Two principal delaying modes have been established: delay-by-time, and delay-by-events. In the delay-by-time mode, a selectable voltage is typically provided by a precision linear potentiometer and compared with a delaying sweep ramp voltage to generate a delayed sweep trigger at any point in time along the delaying sweep. In the delay-by-events mode, a particular event, such as one pulse in a data stream, is selected for initiation of the delayed sweep. Adjusting the desired event count limit, however, has always been somewhat cumbersome or difficult.

One particular prior art method of delay-by-event count adjustment is taught in U.S. Pat. No. 3,843,873 to Bevile et al. Here, a variable-frequency clock, the rate of which is selected by a front-panel control, is utilized to increment or decrement a reversible counter thereby to select an event count at which a delayed sweep will be activated. Not only are many mechanical and electrical parts required for this technique, but the actual selection requires skill and patience on the part of an operator.

Another feature of some oscilloscopes is the ability to determine the condition of a set of data input lines and to initiate a sweep when the data is recognized as a preselected word. In some delayed sweep oscilloscopes the sweep may be delayed until after the word has been recognized a set number of times. In the past, methods to modify the word to be recognized have involved the use of front-panel setups with toggle switches, keyboards, thumbwheels, and LED (light-emitting diode) displays also requiring substantial space and mechanical and electrical parts and often being slow or cumbersome to use.

What is needed and what would be useful is a method and apparatus for rapidly modifying displayed parameters which utilizes controls on the oscilloscope front panel also used for other functions.

SUMMARY OF THE INVENTION

According to one aspect of the present invention, a string of digits representing the decimal number of occurrences (the count limit) of a delaying event required to trigger a delayed sweep on an oscilloscope is displayed on the oscilloscope screen and altered by operation of a pair of control knobs otherwise used to control other oscilloscope functions. A first control knob is rotated to control the placement of a cursor on the screen to select one of the digits to be changed and then a second control knob is rotated to increment or decrement the digit, each digit having a value from 0 to 9. The process is repeated until all of the digits in the string have been selected and adjusted.

Additionally, when a selected digit is incremented from 9 to 0 using the second control knob, the digit to the left is incremented while if a digit is decremented from 0 to 9, the digit to the left is decremented. Also, when a digit is incremented to its maximum permissible value (as limited by a counter) and all the digits to its left are at their maximum value, the cursor automatically moves to the next digit to the right. Similarly, if a digit is decremented to 0 and all digits to the left are 0, then the cursor moves to the next digit to the right. If the portion of a currently displayed triggering signal to be displayed in a delayed sweep is highlighted while the count limit is being adjusted, the automatic cursor movement feature permits an operator to adjust the count limit using only the second control knob while watching the movement of the highlighted portion of the displayed triggering signal.

In still another aspect of the invention, the first and second control knobs are utilized in a similar fashion to adjust a "word recognizer" number also displayed by the oscilloscope. The word recognizer number represents the condition of a set of data input lines which will initiate an event signal to be used by the oscilloscope in sweep triggering.

It is accordingly an object of the present invention to provide a new and improved method and apparatus for rapidly adjusting parameters controlling oscilloscope operation.

It is another object of the present invention to provide a new and improved method and apparatus for rapidly adjusting the delay-by-events and word recognizer numbers in a delayed sweep oscilloscope.

It is a further object of the present invention to provide a new and improved method and apparatus for adjusting displayed oscilloscope parameters utilizing oscilloscope front panel control knobs otherwise used for other functions.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

Figure 1:
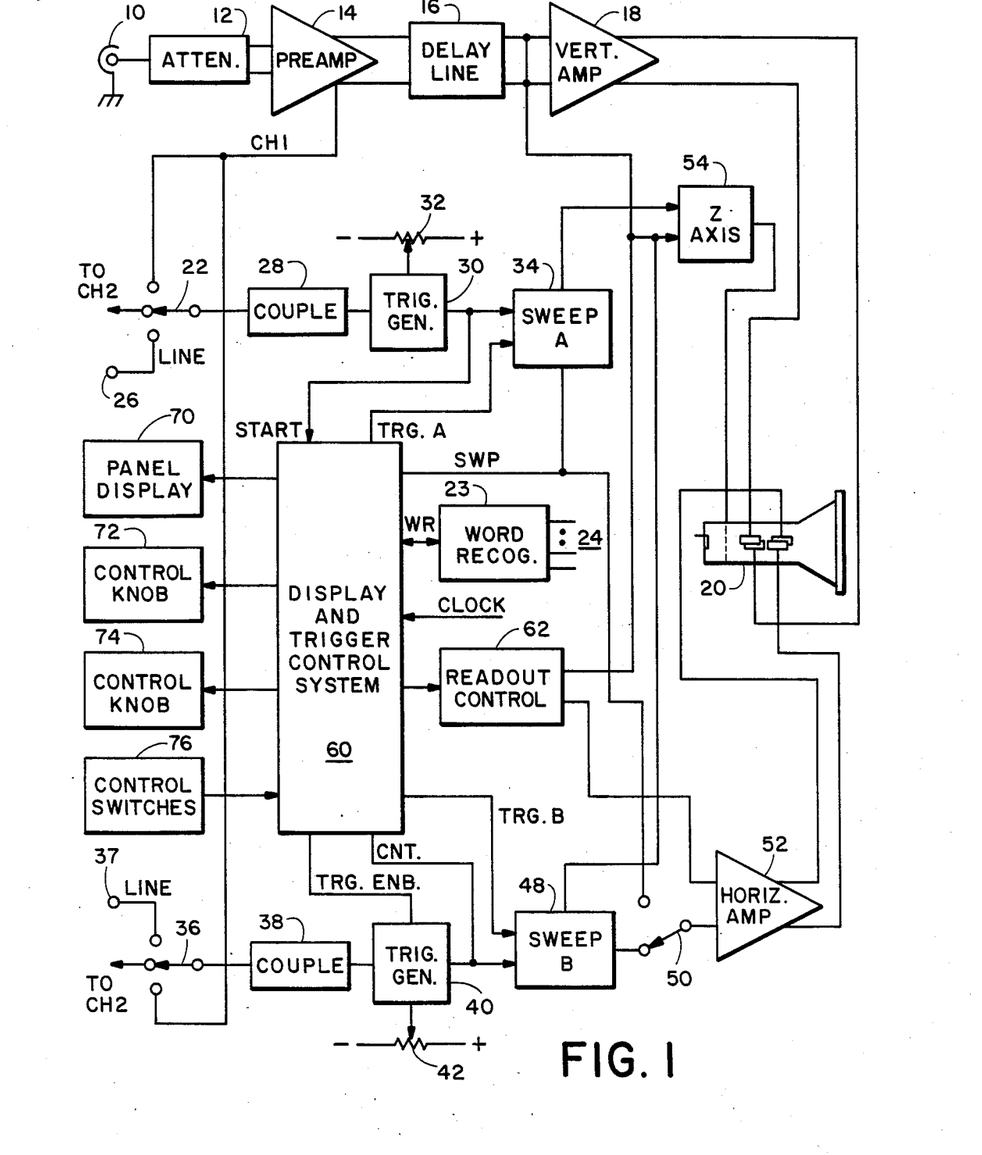
FIG. 1 is a block diagram of a portion of a delayed sweep oscilloscope utilizing the present invention.

Referring to FIG. 1, the trigger and sweep circuits of an oscilloscope, illustrated in block diagram form, are adapted to provide delayed sweep operation controlled according to the present invention. Connected to input terminal 10 is an input signal to be observed which is ultimately applied to the vertical deflection plates of cathode-ray tube (CRT) 20 through controllable attenuator 12, preamplifier 14, delay line circuit 16 and vertical output amplifier 18. Trigger source switch 22 is used to select trigger signals from various sources including channels CH1 and CH2 and power line (LINE) trigger signal sources. The trigger signal for channel 1 is derived from vertical preamplifier 14. Although only one vertical channel is shown in this example, oscilloscopes typically include two or more vertical channels. For multi-channel oscilloscopes, trigger signals are derived from each channel. The LINE trigger signal appears at terminal 26 for providing a triggering signal from any power line frequency related circuits.

The oscilloscope may also be equipped with word recognizer 23, a device which may be programmed to transmit a trigger signal (WR) to display and trigger control system 60 on, receipt of a clock signal (CLOCK) whenever data on/digital input lines matches a predetermined word. Display and trigger control system 60 may be programmed to trigger either the A or B sweep circuits upon receipt of the trigger signal from the word recognizer.

The selected trigger signal from trigger source circuit 22 is applied to trigger coupling circuit 28 for selecting either AC or DC coupling methods. In the DC coupling method, all frequency components of a signal are coupled to the trigger-generator circuitry while in the AC coupling method signals are capacitively coupled to block low frequency signal (e.g. 60 Hz and below) components.

The A channel trigger signal, passed through coupling circuit 28, is then applied to trigger generator 30 for generating a fast trigger pulse by comparing the level of such trigger signal with a controllable trigger level from A TRIG LEVEL potentiometer 32. An output trigger signal from trigger generator 30 may be used to initiate A sweep generator 34 or may be used by display and trigger control system 60 to initiate delayed triggering functions discussed hereinbelow. A sweep signal from sweep generator 34 is applied to the horizontal deflection plates of CRT 20 by way of sweep mode selection switch 50 and horizontal output amplifier 52.

B sweep circuitry is similar to the aforementioned A sweep circuitry including a trigger source circuit 36, CH2 connector, trigger coupling circuit 38, trigger generator 40, B trigger level control potentiometer 42, and B sweep generator 48. The B sweep signal from sweep generator 48 is also applied to the horizontal deflection plates of CRT 20 through switch 50 and horizontal amplifier 52.

Although not shown in FIG. 1, the A trigger generator circuit 30 is designed to operate in either automatic level (AUTO LEVEL), automatic (AUTO), or normal (NORM). AUTO LVL is a trigger mode wherein trigger level is automatically established on a triggering signal and free runs the sweep in the absence of a triggering signal. In the AUTO mode the sweep free runs in the absence of a triggering signal and the trigger level is manually adjusted using TRIG LEVEL potentiometer 42. In the NORM mode sweep is triggered and runs when a triggering signal compatible with the setting on potentiometer 42 is applied.

The sweep circuits may operate in either of two delaying modes (delay-by-time or delay-by-events) while in either of two triggering modes (run-after-delay or trigger-after-delay). In the delay-by-time, run-after-delay mode, A sweep circuit 34 produces a ramp-type output signal (SWP) upon initiation by a trigger signal (TRG A) from display and trigger control circuit 60 upon receipt of a START signal from trigger generator 30. When the SWP signal reaches a predetermined level, control circuit 60 transmits a TRG B signal to B sweep generator 48 initiating the B sweep. Alternatively, in the delay-by-time, trigger-after-delay mode, when the SWP signal reaches the predetermined level, control circuit 60 transmits a TRG ENB signal enabling B trigger generator 40. The B sweep is then initiated on the next trigger pulse generated by trigger generator 40.

In a delay-by-events mode either the A or the B sweep may be delayed by a predetermined number of B trigger events following receipt of a starting signal. The starting signal may be the A trigger signal (START) from trigger generator 30. Alternately, the starting signal may be a trigger signal (WR) from the word recognizer 23. The START or the WR signal is transmitted to control circuit 60 which begins counting B trigger events received from the B trigger generator 40 over the CNT signal line from trigger generator 40. When the B trigger event count reaches a predetermined limit, control circuit 60 initiates either a TRIG A signal to A sweep generator 34 or a TRIG B signal to B sweep generator 48, depending on the sweep to be delayed, to start the delayed sweep. The TRIG A or TRIG B signals starting the A or B sweeps may also be delayed until control circuit 60 receives a selected number of word recognizer 23 WR signals following occurrence of a START trigger event.

The A and B sweeps may also operate in a logic trigger mode where the A sweep may be triggered without delay by various logical combinations of signals from the A and B triggers and where the A or the B sweeps may be triggered by control system 60 upon receipt of a WR signal from the word recognizer 23.

A number of oscilloscope operating parameters including the delay-by-events configuration and count limits, the word recognizer configuration, the word to be recognized, and the logic trigger configuration may be selectively displayed on the CRT 20 screen by control circuit 60 acting through readout control circuit 62 which provides inputs to vertical amplifier 18, horizontal amplifier 52 and Z axis amplifier 54 to generate the display in a well known manner. By operating control knobs 72 and 74, mechanically linked to control system 60, an operator may adjust the count limit and word recognizer parameters as described in more detail herein below.

Figure 2:
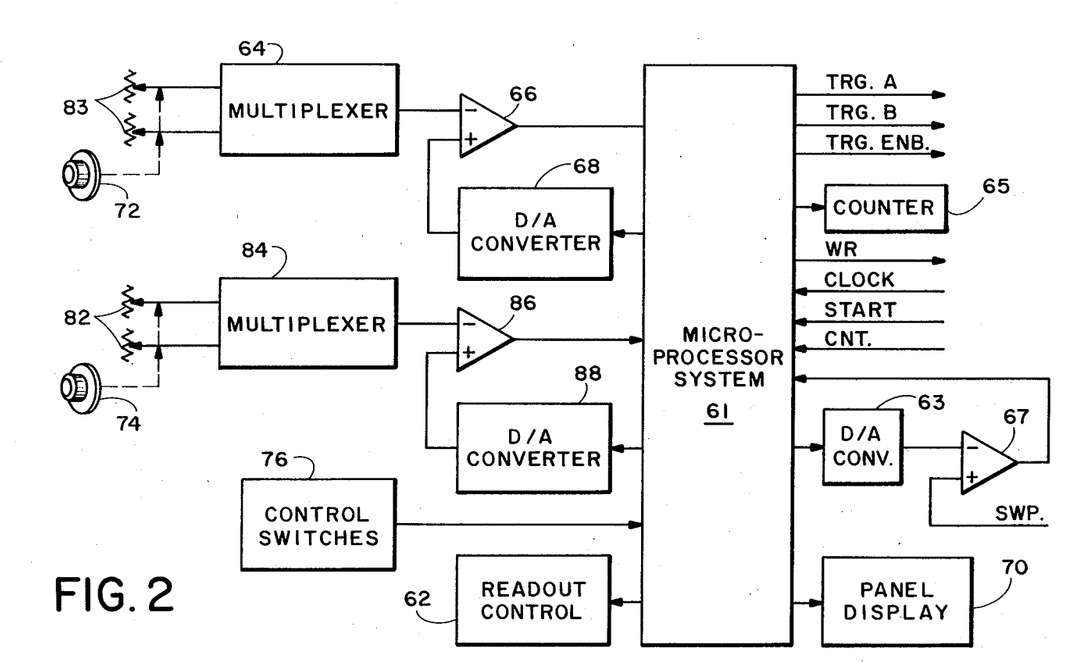
FIG. 2 is a block diagram depicting a portion of the oscilloscope of FIG. 1 in more detail.

A particular embodiment of control system 60 is depicted in block diagram form in FIG. 2. Control knobs 72 and 74 operate dual pots 83 and 82 which are of the type providing a continuously varying analog voltage signals through 360 degrees of knob rotation. The outputs of pots 83 are coupled to multiplexer 64 and then to the inverting input of comparator 66. An analog signal from digital-to-analog (D/A) converter 68, proportional to a digital input from microprocessor system 61, is connected to the noninverting input of comparator 66. The output of comparator 66 is applied to microprocessor 61. The microprocessor performs a successive approximation to digitize pot rotation by applying varying digital quantities to D/A converter 68 to determine the point at which comparator 66 changes state, the movement rather than the relative position of the pots being used to control oscilloscope functions. Such digitizing methods are well known in the art and are not further detailed herein. Microprocessor 61 digitizes the rotation of pots 82 in the same way, with pots 82 connected to multiplexer 84, providing the inverting input to comparator 86, and with D/A converter 88, controlled by microprocessor 61, providing the noninverting input.

Also a part of control system 60 is delay-by-events counter 65, utilized in the delay-by-events mode to count trigger pulses from the B trigger generator over the CNT line upon receipt of a starting signal from microprocessor 61 or to count WR signals from the word recognizer. When the count reaches a limit set by microprocessor 61, counter 65 transmits an indicating TRG signal to the microprocessor system which then generates a TRG A, TRG B or a TRG ENB signal, to initiate the selected delayed sweep.

Another part of control system 60 is delay-by-time comparator 67, utilized in the delay-by-time mode to generate a TRG signal when the SWP signal voltage applied to the noninverting input of comparator 67 exceeds the signal voltage from D/A converter 63 connected to the inverting input of 15 the comparator. The output signal of converter 63 is proportional to selected input data supplied to the converter from microprocessor 61. When microprocessor system 61 receives the TRG signal from comparator 67 it generates the appropriate TRG B or TRG 20 ENB signal depending on the selected mode and sweep channel.

Figure 3:
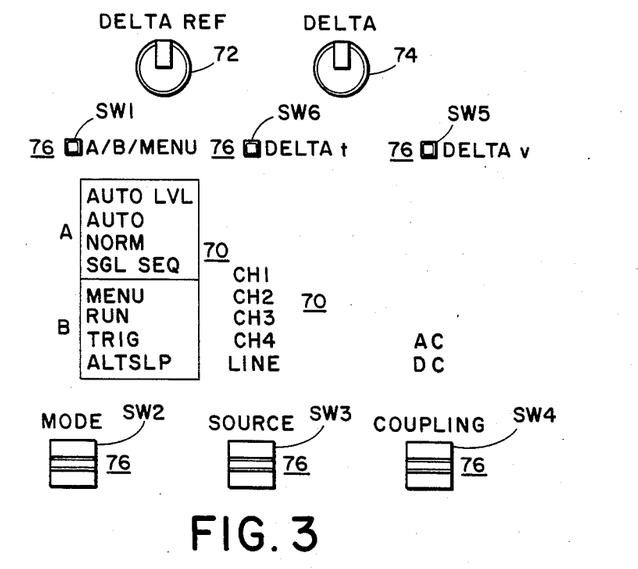
FIG. 3 is a front view of a portion of a control panel which may be used in conjunction with the oscilloscope of FIG. 1, FIGS. 4A to 4E depict menus and parameters which may be displayed on the CRT screen of the oscilloscope of FIG. 1, and FIGS. 5A and 5B are a flowchart of a computer program used in conjunction with a preferred implementation of the present invention.

FIG. 3 depicts a portion of the controls and indicators of the front panel of a four channel oscilloscope similar to the two channel oscilloscope of FIG. 1. Controls and indicators include indicating lights 70, A/B-/MENU, MODE, SOURCE, COUPLING, DELTA v and DELTA t control switches 76, DELTA REF control knob 72 and DELTA control knob 74.

A/B/Menu switch SW1 directs MODE, SOURCE, COUPLING AND LEVEL controls to either the A trigger or the B trigger. Up/down trigger MODE selection switch SW2 is pushed up or down to select any of AUTO LVL, AUTO, NORM or SGL SEQ modes for the A trigger circuit when in the A select mode, or to select MENU, RUN AFTER DELAY or TRIG AFTER DELAY when in the B select mode. When in the A sweep select mode, the A trigger mode can be changed by raising or depressing mode select switch SW2. When in the B trigger select mode, operation of SW1 changes the B trigger mode. The select mode may be changed from the A to the B modes by pressing SW1 once and to a menu mode by depressing SW1 once again. Depressing SW1 a third time restores the A select mode.

The menu mode is indicated by the MENU indicating lamp 76 and may be entered either by using the A/B-/MENU switch SW1 or by using MODE switch SW2 when in the B select mode. In the menu mode, menus for selecting various triggering configurations are displayed on the oscilloscope CRT as discussed in more detail herein below.

At the bottom center of the panel, SOURCE switch SW3 is an up/down lever switch for selecting the trigger signal source for either the A or the B trigger with the selected source indicated by source indicating lamps CH1, CH2, CH3, CH4 or LINE directly above the switch. Assuming now that the H1 trigger source is selected in a certain instance, the CH1 indicator lamp is lit. CH2, CH3 or CH4 may then be selected by pushing down the SW3 switch from one to three times while the LINE source may be selected by pushing down the SW3 switch four times. On the other hand, the trigger source is switched sequentially from LINE to CH1 by pushing up on switch SW3. By continuously holding the switch up or down the selection is stepped repeatedly.

In a similar fashion up/down COUPLING switch SW4 may be operated to select the method of coupling the triggering signal to the A and B trigger generator circuitry from the DC and AC coupling modes.

DELTA v switch SW 5 is a momentary pushbutton which activates a "delta volts" measurement function when pressed. When the delta volts function is activated, the CRT displays two horizontal cursor lines superimposed on a displayed A sweep waveform along with a digital readout indicating the equivalent voltage represented by the separation of the two cursors. The position of one cursor is set by DELTA REF control knob 72 while the position of the other cursor is controlled by DELTA control knob 74. Similarly DELTA t switch SW6 activates a "delta time" measurement function when pressed wherein two vertical cursor lines are displayed on the CRT screen along with data representing the time difference between the two cursors. The position of one cursor is controlled by the DELTA REF knob 72 while the position of the second cursor is controlled by the DELTA knob 74.

Figure 4A:
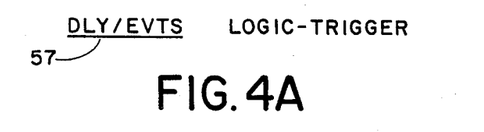

Referring to FIG. 4A, upon entering the menu mode, a Main Menu is displayed in the upper right hand corner of CRT 20 consisting of a pair of menu function codes (DLY/EVTS and LOGIC-TRIG) with a cursor underlining the selected menu function. The cursor may be moved to the left or the right to select the desired function by suitable oscilloscope front panel mounted cursor control means. When the appropriate function code is selected trigger mode switch SW2 is pushed up to display a configuration menu for the selected function.

Figure 4B:
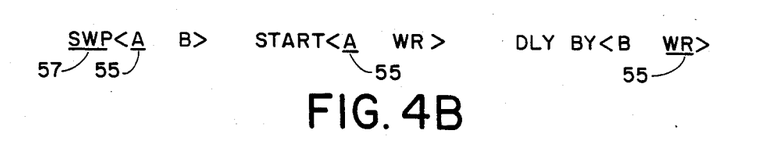

When the delay-by-events (DLY/EVTS) function is selected, and mode switch SW2 is pushed up, a Delay-by-Events Configure Menu (FIG. 4B) replaces the Main Menu on the screen. Three bracketed selection fields each identified by a field code (SWP, START and DLY BY) are displayed with each field code representing an oscilloscope operating parameter. A set of configuration codes is contained within each bracketed field, each configuration code representing an alternative operating configuration within the field parameter. The SWP field indicates the sweep to be delayed, either A or B, by a sweep configuration cursor underlining either the A or the B symbols in the field. The sweep to be delayed may be selected by moving the configuration cursor from A to B or from B to A. Similarly the START field utilizes another moveable configuration cursor to indicate the event which will start the delay count, either the word recognizer (WR) or the A trigger generator (A). If the B Sweep field is selected to be delayed, the START field defaults to the A trigger event by automatically relocating the configuration cursor from WR to A. Conversely, if the word recognizer is selected as the START event, the SWP field defaults to A. The DLY BY field uses still another moveable cursor to indicate the delaying event counted to initiate the delayed sweep. Either the B trigger event (B) or the word recognizer event (WR) can be selected by moving the configuration cursor.

Figure 4C:
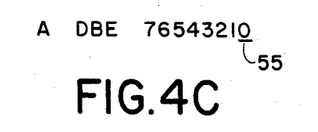

When B sweep delay-by-events is selected and mode select switch SW2 is pushed up, the menu is removed from the screen and the number of occurrences (the count limit) of the delaying event necessary to initiate the sweep is displayed at the top of the CRT screen along with a letter (A or B) indicating the sweep being delayed by events. An example of the display is shown in FIG. 4C. A digit select cursor appears under one of the digits in the number displayed. The count limit may be changed by first selecting the digit in the number to be changed by using knob 72 to move the digit select cursor to underline the selected digit and then by rotating knob 74 to change the value of the digit. If a digit is incremented from 9 to 0 (nine to ten), the digit to the left is incremented; if a digit is decremented from 0 to 9 (ten to nine), the digit to the left is decremented. If a digit is incremented to its maximum possible value (as limited by the count capacity of counter 65) and all the digits to the left are at their maximum values, the digit select cursor moves to the next digit to the right. If a digit is decremented to 0 and all digits to its left are 0, then the cursor moves to the next digit to the right. Thus the event count number displayed may be rapidly altered by using both knobs 72 and 74 to successively select and alter the digits in the number or by using only knob 74 and taking advantage of the automatic incrementing and cursor shifting features.

Figure 5A:
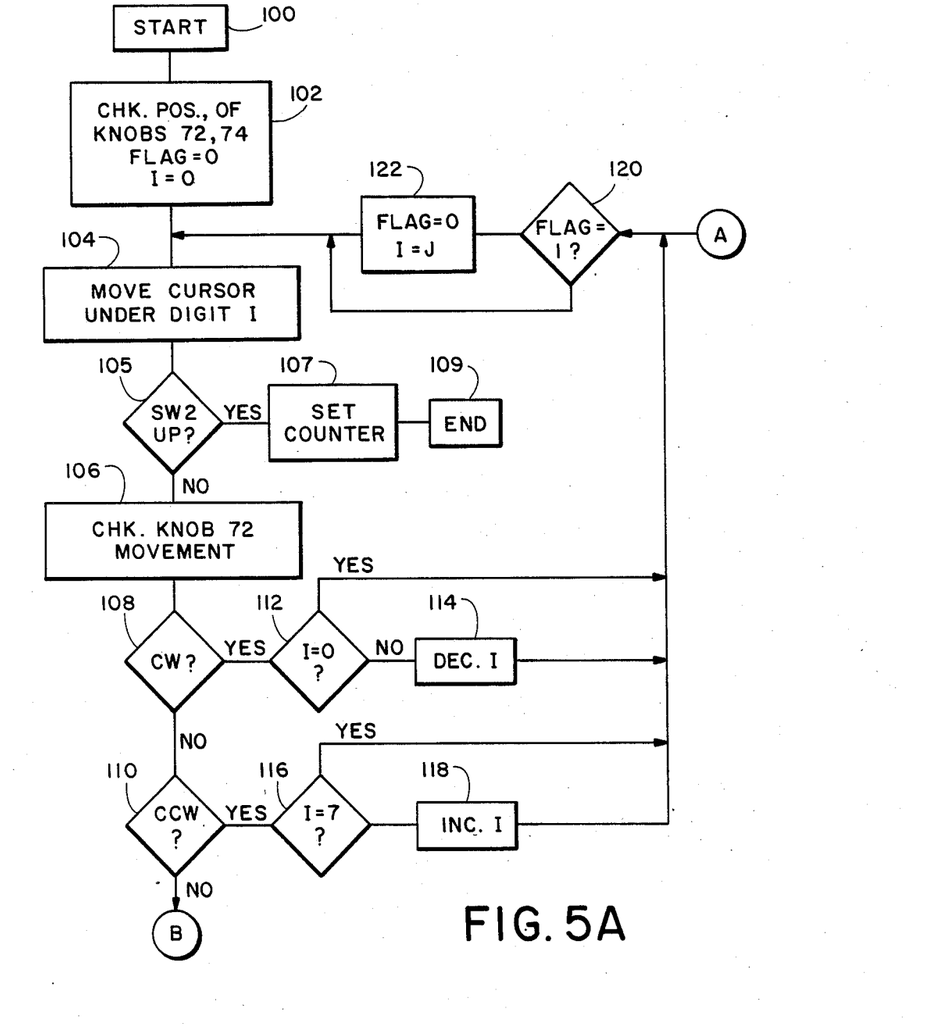
Figure 5B:
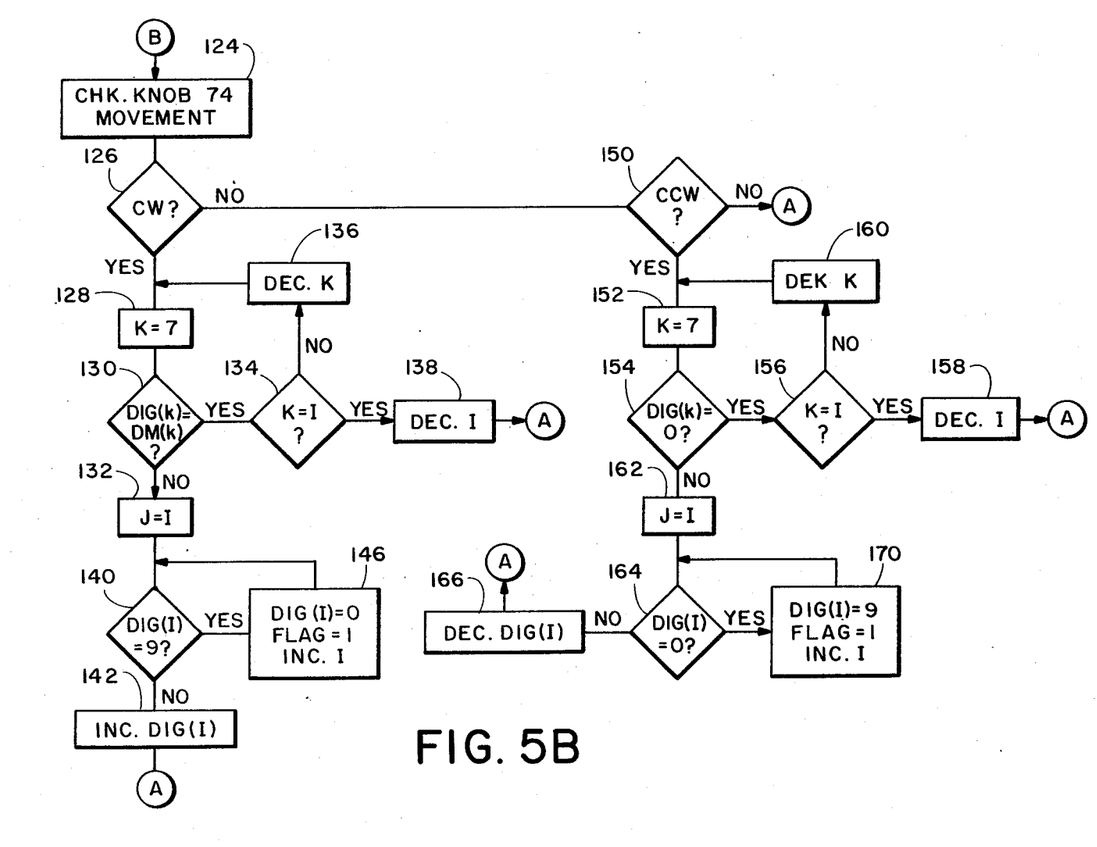

An algorithm used to program microprocessor 62 for modifying the counter limit number is flowcharted in FIGS. 5A and 5B. The routine begins in block 100 as the counter limit number is displayed on the screen. In the preferred embodiment, the counter limit number contains eight digits referenced from 0 to 7 from the least significant (rightmost) digit to the most significant (leftmost) digit. The value of each digit is stored as DIG(I) where I is the digit reference number. In block 102, I is set to 0, a FLAG is set to 0, and a subroutine is called wherein microprocessor 62 checks the current position of DELTA REF control knob 72 and DELTA control knob 74.

Then in block 104 the underlining cursor, indicating which digit in the number has been selected for alteration, is placed on the screen under the Ith digit, initially the rightmost digit (I=0). In block 105, microprocessor checks to see if oscilloscope front panel switch SW2 has been raised indicating the operator wants to end the number changing subroutine. If not, then in block 106 a subroutine is called wherein microprocessor 62 checks knob 72 for movement since the position was last checked. If knob 72 has been moved in a clockwise (CW) direction, block 108 then directs program flow to block 112 where the value of I is checked to determine if the cursor is under the least significant digit (digit 0) of the count limit number. If the cursor is under digit 0 then block 112 directs program flow back to block 104 through block 120 without changing the current value of I. If the cursor is not under digit 0 then block 112 directs control to block 114 to decrement I and then through block 120 back to 104 where the cursor is moved one digit to the right.

Referring back to block 108, if control knob 72 has not been moved clockwise then program flow is directed to block 110. If knob 72 has been moved counterclockwise (CCW) then block 110 directs program flow to block 116 where the value of I is checked to determine if the cursor is under the leftmost digit 7. If it is, then block 116 directs program flow back to block 104 through block 120 and the position of the cursor remains unchanged. Otherwise, in block 118 the value of I is incremented by one and program flow again passes through block 120 to block 104 where the cursor is now moved one digit to the left.

If DELTA REF knob 72 has not been moved, then block 110 directs the program to block 124 where a subroutine is called to check the position of DELTA control knob 74. The cursor underlined Ith digit is incremented by turning knob 72 clockwise unless the Ith digit and all digits to the left are at their maximum counter limits. If the knob has been moved clockwise since the last check, block 126 directs control to block 128 where a counter K is set to 7 and then to block 130 where the value of the Kth digit, DIG(K), is compared to the value of the Kth digit, DM(K), when the counter limit number is at its maximum possible value, depending on the capacity of the counter. If DIG(K) is equal to DM(K) then block 134 checks to see if K is equal to I. If not, K is decremented by one in block 136 and program operation is returned to block 128. If all the digits to the left of the currently underlined digit are at their DM(K) values, then the program will continue to circulate through the blocks 128, 130 and 134 loop until the value of K is equal to I. At this point program flow is directed by block 134 to block 138 where the value of I is decremented by one and the program is diverted back through block 120 to block 104 where the cursor is moved one digit to the right.

If not all of the digits to the left of digit I are at their DM(K) values then when knob 74 is moved clockwise, block 130 passes program control to block 132 where the current value of I is saved as J and then to block 140 where the value, DIG(I) of the Ith digit is checked. If DIG(I)=9 then block 140 diverts the program to block 146 were the value of digit I is set to nine, a FLAG is set to 1 and then I is incremented by one. Program flow then reverts to block 140. The program circulates through blocks 140 and 146 loop until the Ith digit is no longer 9. When the value of the Ith digit is less than 9, block 140 directs program flow to block 142 where the value of the Ith digit, DIG(I), is incremented and then to block 120. If I is different than J then FLAG=1 and block 120 directs control to block 122 where the FLAG is reset to zero and I is set to J so that when control is returned to block 104 the current cursor position remains unchanged.

Turning knob 74 counter clockwise will decrement the portion of the count limit number including and to the left of the underlined Ith digit unless the Ith digit and all digits to the left of the Ith digit are zero. When knob 74 is not turned since last checked, block 126 diverts program flow to block 150 which passes program operation back to block 104 through block 120. However if knob 74 has been turned counterclockwise since it was last checked, block 150 directs program flow to block 152 where counter K is set to 7 and then to block 154 where the value of the Kth digit, DIG(K), is compared to 0. If DIG(K) equals 0 control is passed to block 156 where K is compared to I. If K does not equal I, block 156 directs the program to block 160, where the value of K is decremented by 1, and then back to block 154. Program flow continues to circulate through the block 154, 156 and 160 loop checking the value of all the digits to the left of the Ith digit until either a nonzero digit is found in block 154 or K equals I in block 156 indicating that the Ith digit was checked and found to be zero. In the latter case the value of I is decremented by 1 and program flow is directed back through block 120 to block 104 where the cursor is moved one digit to the right without changing the value of the selected digit. If one of the digits to the left of the Ith digit is nonzero, then block 154 directs program to block 162 where the value of I is saved as J and then to block 164 where the value of the Ith digit, DIG(I), is compared to zero. If DIG(1) is not zero then in block 166 the value of DIG(I) is decremented by 1 and program flow is directed back to block 104 through block 120. If, on the other hand, DEC(I) is zero, then block 164 directs the program to block 170 where the value of DIG(I) is set to 9, the FLAG is set to 1, and I is incremented by one. Program flow then reverts to block 164. The program loops through blocks 164 and 170 successively setting the values of the digits to the left of the currently selected digit to 9 until in block 164 it finds a digit whose value is non-zero. Block 164 then passes control to block 166 where the value of the nonzero Ith digit, DIG(I) is decremented by 1. Program flow is directed back to block 120 and then, since the value of FLAG is 1, to block 122 where FLAG is reset to 0 and I is reset to J so that the cursor remains in its current position when operation is subsequently directed to block 104.

Finally, in block 105, if switch SW3 is pushed up program flow is directed to block 107 where the count limit number is reset to the value displayed on the screen and then to block 109 where the software routine ends.

Figure 4D:
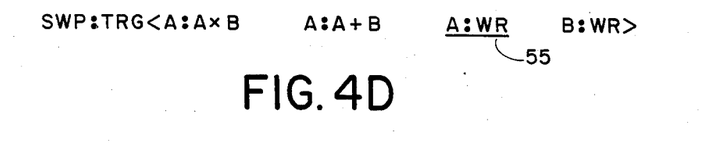

Referring again to FIG. 4A, if the LOGIC-TRIG function is selected from the Main Menu, and the trigger MODE switch is pushed up, the Logic-Trigger-Configure Menu of FIG. 4D is displayed. The sweep (SWP) to be triggered and the source (TRIG) of the trigger are both selected from this menu by moving a configuration cursor to underline the appropriate selection code. The selections are A:A×B (the A sweep is triggered when both the A and B trigger generators produce a trigger signal at the same time), A:A+B (the A sweep is triggered when either an A or a B trigger generator produces a trigger signal), A:WR (the A sweep is triggered when the Word Recognizer detects a selected word), or B:WR (the B sweep is triggered when the word recognizer detects a selected word). When the logic-trigger configuration is correct, the trigger MODE switch SW2 is pushed up to activate the function selected. However if the word recognizer function (WR) is selected a Word-Recognizer-Configure Menu is displayed as shown in FIG. 4E.

Figure 4E:
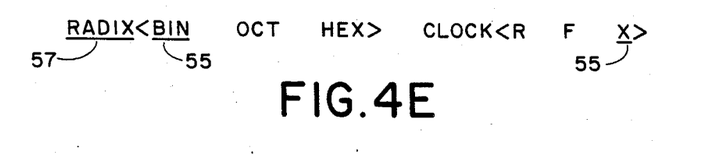

Referring now to FIG. 4E, the Word-Recognizer-Configuration menu is used to set the word recognizer's RADIX and CLOCK field parameters. In the RADIX field, the word to be recognized may be configured, by locating a configuration cursor, as either binary (BIN), octal (OCT) or hexadecimal (HEX). In the same manner, the clock edge used to acquire data in the word recognizer may be configured in the CLOCK field as either a rising edge (R), a falling edge (F) or neither (X), as when the word recognizer is to operate in an asynchronous mode. With the word recognizer configured as desired, the trigger MODE switch SW2 may be pressed up again to activate the selected function and to deactivate the menu mode.

When the oscilloscope utilizes the word recognizer as a trigger or a delaying mechanism, the status of the word recognizer is displayed in the format shown in FIG. 4F where "t" is the trigger selected (A or B); "c" is the clock mode (R,F or X), "q" is a qualifier bit (0 or 1) and "word" is the value of the data to be recognized by the word recognizer displayed in the selected radix-binary, octal or hexadecimal. The DELTA REF control knob 72 and the DELTA control knob 74 may be used to change the selection for the underlined field. The word to be recognized may be altered one digit at a time by using the DELTA REF knob to select the digit and then using the DELTA knob to alter the digit. The radix and qualifier bit may also be altered in a similar fashion. When the status of the event count for the delay-by-events function and the status of the word recognizer are displayed at the same time, the DELTA REF control will move the selection cursor across both fields. An algorithm for programming microprocessor 62 to provide for modification of the word recognizer word would be similar to that shown in FIG. 5 for modifying the count limit number and is therefore not further detailed herein.

Thus it is seen that the DELTA REF control knob 72 and the DELTA control knob 74 are used to control a number of functions including placement of the DELTA t and DELTA v cursors, adjustment of the delay-by-event count and word recognizer numbers. Both knobs may be used to adjust such numbers, the DELTA REF knob being rotated to select a digit and the DELTA knob being rotated to alter the selected digit.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A method for altering a parameter having a plurality of digits comprising the steps of:
   (a) rotating a first control knob to select a digit of the parameter, and
   (b) rotating a second control knob to adjust the value of the selected digit, and to adjust the value of another digit of said parameter when the value of the selected digit is adjusted past a predetermined limit.

2. A method as in claim 1 wherein when the selected digit is incremented beyond a predetermined high limit by rotating the second knob, the selected digit takes on a predetermined low limit and said another digit is incremented and when the selected digit is decremented below said predetermined low limit by rotating the second knob, the selected digit takes on said predetermined high limit and said another digit is decremented.

3. A method as in claim 1 wherein when said selected digit is incremented to a predetermined high limit by rotating said second knob when all more significant digits are at predetermined high limits, a lesser significant digit is selected and when said selected digit is decremented to a predetermined low limit by rotating said second knob when all more significant digits are at predetermined low limits, a lesser significant digit is selected.

4. A method as in claim 1 wherein said parameter is displayed on a screen forming part of an oscilloscope employing a delay-by-events sweep function and the parameter being displayed and adjusted comprises a delay-by-events count limit.

5. A method as in claim 1 wherein said parameter is displayed on a screen forming part of an oscilloscope employing a word recognizer and the parameter being displayed and adjusted comprises a word to be recognized by the word recognizer.

6. A method as in claim 1 wherein said parameter is displayed on a screen and rotation of the first knob controls the movement of a cursor on the screen, digit selection being indicated by the position of the cursor with respect to the selected digit.

7. An apparatus for altering a parameter having a plurality of digits, the apparatus comprising:
   a first and a second control knob,
   means, responsive to the rotation of the first knob, to alter selection of a parameter digit as the first control knob is rotated, and
   means, responsive to the rotation of the second control knob, to alter the value of a selected parameter digit as the second control knob is rotated and to adjust the value of another digit when the value of the selected digit reaches a predetermined limit.

8. An apparatus as in claim 7 wherein said altering means responsive to the rotation of the first control knob comprises:
   means for producing a digital signal of variable magnitude,
   first means for producing a first analog output signal varying with said digital signal,
   second means for producing a second analog output signal varying with the rotation of said first control knob, and
   a comparator coupled to produce a digital output signal which changes state when the magnitude difference between the first and second analog output signals of the first and second means changes sign.

9. An apparatus as in claim 7 wherein the first and second control knobs are utilized to control another function when the parameter is not being adjusted.

10. An apparatus as in claim 9 wherein said another function comprises control of the movement of cursors on an oscilloscope screen used in the measurement of the time difference between two points on a displayed waveform.

11. An apparatus as in claim 9 wherein said another function comprises control of the movement of cursors on an oscilloscope screen used in the measurement of a voltage difference between two points on a displayed waveform.

12. An apparatus for altering a parameter displayed on the screen of a delayed sweep oscilloscope, the parameter having a plurality of digits and representing an event count necessary to initiate a delayed sweep, the apparatus comprising:
   a first and a second control knob,
   means, responsive to the rotation of the first control knob, to alter selection of a parameter digit as the first control knob is rotated, and
   means, responsive to the rotation of the second control knob, to alter the value of a selected parameter digit as the second control knob is rotated and to adjust the value of another digit when the value of the selected digit reaches a predetermined limit.

13. A delayed sweep oscilloscope comprising:
   means to count the occurrences of an event,
   means to compare the event occurrence count to a multi-digit numeric count limit parameter and to produce a trigger signal when the event occurrence reaches the value of the numeric count limit parameter,
   means to display the count limit parameter on the oscilloscope screen,
   a first and a second control knob,
   means, responsive to the rotation of the first control knob, to alter selection of a count limit parameter digit as the first control knob is rotated, and
   means, responsive to the rotation of the second control knob, to alter the value of a selected parameter digit as the second control knob is rotated and to adjust the value of another digit when the value of the selected digit reaches a predetermined limit.

* * * * *